United States Patent
Chen et al.

(10) Patent No.: US 7,579,250 B2
(45) Date of Patent: Aug. 25, 2009

(54) METHOD FOR REDUCING HOT CARRIER EFFECT OF MOS TRANSISTOR

(75) Inventors: Min-Hsian Chen, Hsinchu County (TW); Ching-Hsing Hsieh, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 65 days.

(21) Appl. No.: 11/830,783

(22) Filed: Jul. 30, 2007

(65) Prior Publication Data

US 2008/0038937 A1 Feb. 14, 2008

Related U.S. Application Data

(62) Division of application No. 10/908,071, filed on Apr. 27, 2005.

(51) Int. Cl.
*H01L 21/336* (2006.01)
*H01L 21/8238* (2006.01)

(52) U.S. Cl. .......... 438/303; 438/229; 438/230; 438/233; 257/E21.029; 257/E21.035; 257/E21.252

(58) Field of Classification Search .......... 438/229, 438/233, 303, 595, 230; 257/310, 410, 411, 257/216, 287, E21.029, E21.035, E21.038, 257/E21.252, E21.268
See application file for complete search history.

(56) References Cited

U.S. PATENT DOCUMENTS 5,707,889 A * 1/1998 Hsu et al. .......... 438/362
2005/0179115 A1 * 8/2005 Rossi et al. .......... 438/724

* cited by examiner

*Primary Examiner*—Walter L Lindsay, Jr.
(74) *Attorney, Agent, or Firm*—Jianq Chyun IP Office

(57) ABSTRACT

A semiconductor device structure is described, including a MOS transistor, a silicon-rich silicon nitride layer having a refractive index of about 2.00-2.30, and a dielectric layer. The silicon-rich silicon nitride layer is disposed between the MOS transistor and the dielectric layer, and covers the source/drain region, the spacer and the gate conductor of the MOS transistor.

8 Claims, 1 Drawing Sheet

METHOD FOR REDUCING HOT CARRIER EFFECT OF MOS TRANSISTOR

CROSS-REFERENCE TO RELATED APPLICATION

This application is a divisional of an application Ser. No. 10/908,071, filed on Apr. 27, 2005, now pending. The entirety of the above-mentioned patent application is hereby incorporated by reference herein and made a part of this specification.

BACKGROUND OF THE INVENTION

1. Field of the Invention

The present invention relates to a semiconductor device structure. More particularly, the present invention relates to a semiconductor device structure capable of reducing the hot carrier effect and a method for reducing the hot carrier effect of a metal-oxide-semiconductor (MOS) transistor.

2. Description of the Related Art

MOS transistors are the most important elements in various electronic products. To compactify the electronic products, the dimensions of a MOS transistor have to be reduced. However, such a dimension reduction causes a hot carrier effect affecting the operation of the transistor. More specifically, when the channel length is decreased but the voltage applied is fixed, not only the operation speed of the transistor is increased, but also the lateral electric field in the channel is increased. Thereby, the energy of the channel electrons is increased, while the channel electrons near the drain region can be accelerated to have energy higher than the band gap of the semiconductor.

Therefore, after colliding with the valence-band electrons, the channel electrons near the drain region easily excite the valence-band electrons thereat to the conductive band to form hot electrons. A part of the hot electrons will enter the gate dielectric to cause damages, so that the reliability and the lifetime of the device are reduced.

SUMMARY OF THE INVENTION

Accordingly, one object of this invention is to provide a semiconductor device structure, which is capable of reducing the hat carrier effect to increase the lifetime of the device.

Another object of this invention is to provide a method for reducing the hot carrier effect of a MOS transistor, so as to increase the lifetime of the device.

The semiconductor device structure of this invention includes a MOS transistor, a silicon-rich silicon nitride layer having a refractive index of about 2.00-2.30, and a dielectric layer. The silicon-rich silicon nitride layer is disposed between the MOS transistor and the dielectric layer, and covers the source/drain regions, the spacer and the gate conductor of the MOS transistor.

According to some embodiments of this invention, the refractive index of the silicon-rich silicon nitride layer may be 2.0-2.05, 2.05-2.10, 2.10-2.15, 2.15-2.20, 2.20-2.25, or 2.25-2.30.

The above semiconductor device structure may further include a metal salicide layer, which is disposed on the source/drain region and the gate conductor and covered by the silicon-rich silicon nitride layer. The material of the metal salicide layer may be selected from the group consisting of nickel silicide, cobalt silicide and titanium silicide, or from nickel alloy silicides, such as nickel platinum silicide, nickel cobalt silicide and nickel titanium silicide.

In addition, the silicon-rich silicon nitride layer in the semiconductor device structure may be a tensile layer that causes a positive stress.

The method for reducing the hot carrier effect of a MOS transistor includes forming a dielectric layer with a refractive index of about 2.00-2.30 over the MOS transistor, wherein the dielectric layer covers the S/D region, the spacer and the gate conductor of the MOS transistor.

According to a preferred embodiment of this invention, the above dielectric layer may include a Si-rich SiN layer. The refractive index of the Si-rich SiN layer may be 2.0-2.05, 2.05-2.10, 2.10-2.15, 2.15-2.20, 2.20-2.25, or 2.25-2.30.

By covering the MOS transistor with a Si-rich SiN layer with a refractive index of about 2.00-2.30, the hot carrier effect is reduced to increase the lifetime of the device.

It is to be understood that both the foregoing general description and the following detailed description are exemplary, and are intended to provide further explanation of the invention as claimed.

DESCRIPTION OF THE PREFERRED EMBODIMENTS

Figure 1:
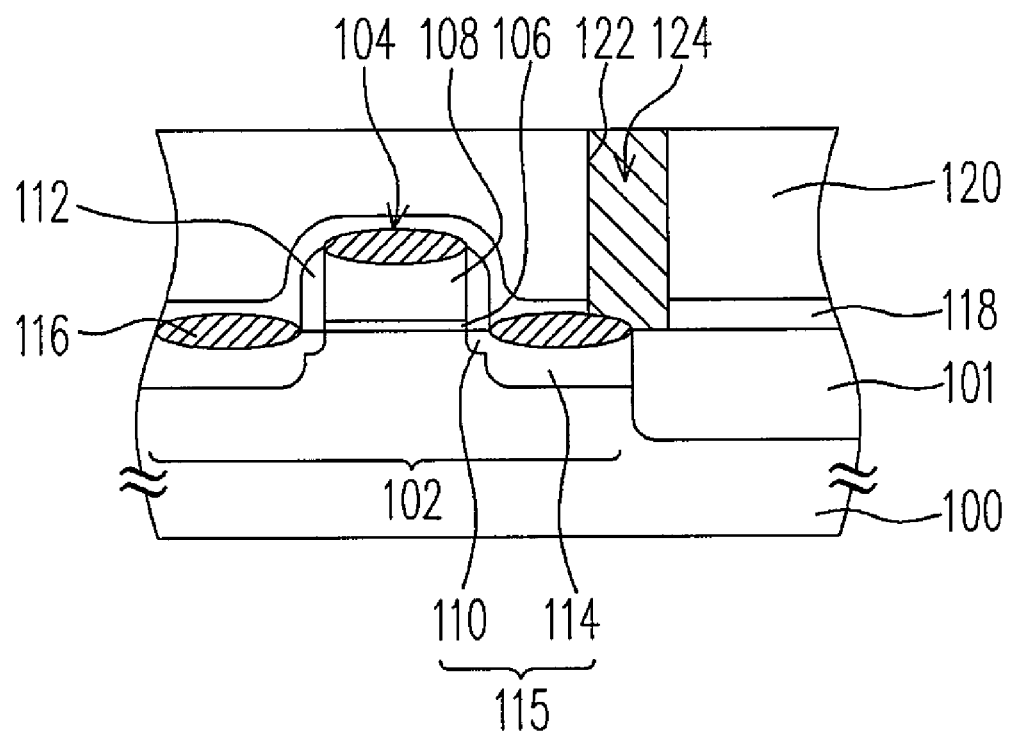
FIG. 1 illustrates a semiconductor device structure according to a preferred embodiment of this invention.

Referring to FIG. 1, an isolation structure 101 is formed on a semiconductor substrate 100 to define an active area 102. AMOS transistor 104 is then formed on the substrate 100, including gate dielectric 106, a gate conductor 108, a spacer 112 and a source/drain region 115 that includes lightly and heavily doped regions 110 and 114. The MOS transistor 104 may be formed by, for example, forming a dielectric layer and a conductive layer and patterning them into the gate dielectric 106 and gate conductor 108, respectively, forming lightly doped regions 110 in the substrate 100 through ion implantation, forming a spacer 112 on the sidewall of the gate conductor 108, and then performing another implantation to form the heavily doped regions 114. The gate conductor 108 may include poly-Si, and its line width may be 90 nm or smaller. The gate dielectric 106 may include silicon oxide, and may have a thickness of 8-20 Å.

In another example, the MOS transistor 104 further includes a metal salicide layer 116 that is disposed on the heavily doped regions 114 and the gate conductor 108. The material of the metal salicide layer 116 may be nickel silicide, cobalt silicide or titanium silicide, or a nickel alloy silicide that is a silicide of an alloy of nickel and a refractory metal like platinum (Pt), cobalt (Co) or titanium (Ti).

Thereafter, a dielectric layer 118 with a refractive index (RI) of about 2.00-2.30 is formed over the substrate 100, the dielectric layer 118 possibly being a Si-rich SiN layer that is formed as a tensile layer. In some cases, the RI of the Si-rich SiN layer is 2.00-2.05. In other cases, the RI of the SiN layer may be 2.05-2.10, 2.10-2.15, 2.15-2.20, 2.20-2.25, or 2.25-2.30.

The Si-rich SiN layer may be formed with the following methods, for example. In some examples using a CVD chamber equipped with a high-frequency (HF) power and a low-frequency (LF) power, the carrier gas may be $N_2$, the reaction gases may be $SiH_4$ and $NH_3$, and the LF power is lowered, for example, from ordinary 400 W to about 0 W, to reduce the bombardments of charged species to the substrate. It is also feasible to lower the HF and LF powers at the same time. For example, the HF power may be lowered from ordinary 600 W to 100 W and the LF power from ordinary 400 W to about 0 W to reduce the bombardments of charged species to the substrate. In other examples using a chamber with a single power source, the power can be lowered from ordinary 450 W to 100-250 W to decrease the decomposition rate of the reaction species.

Alternatively, $N_2$ is used as a carrier gas, $SiH_4$ is introduced in a flow rate of about 60 sccm, and the flow rate of $NH_3$ is lowered from ordinary 30 sccm or even set as 0 to reduce the nitrogen content in the deposited silicon nitride layer. It is also feasible to lower the power and decrease the flow rate of $NH_3$ simultaneously.

After the dielectric layer 118 is formed, another dielectric layer 120 is formed thereon, possibly including silicon oxide or a low-k material. Then, the dielectric layer 120 is etched using a patterned photoresist layer (not shown) as an etching mask to form a contact opening 122 exposing a portion of the dielectric layer 118, which serves as an etching stop layer and is then removed for electrical connection. After the photoresist layer is removed, a conductive material like aluminum (Al) or tungsten (W) is filled into the contact opening 122 to form a contact 124.

EXAMPLES

Examples A1-A2 and B1-B3 use an A-type chamber and a B-type chamber, respectively. The deposition parameters and the experiment result of each example are listed in Table 1.

TABLE 1

|  |  | Example | | |
| --- | --- | --- | --- | --- |
|  |  | A1 | B1 | B2 |
| Recipe | HF (W) | 600 W | 170 W | 100 W |
|  | LF (W) | 0 | 150 W | 0 |
|  | $SH_4$ (sccm) | 500 | 60 | 160 |
|  | $NH_3$ (sccm) | 4000 | 0 | 600 |
|  | $N_2$ (sccm) | 1600 | 3000 | 600 |
| Properties of film | Refractive index | 2.22 | 2.05 | 2.2 |
|  | Si—H (/cm$^3$) | $1.9 \times 10^{22}$ | $6.2 \times 10^{21}$ | $1.8 \times 10^{22}$ |
|  | HCI (year) | 219 | 120 | 379 |

As indicated by Example A1, by turning off the LF power, the Si-rich SiN layer obtained has a higher silicon content and a higher refractive index. The hot carrier injection (HCI) index of the device obtained from Example A1 is 219 years.

Moreover, as indicated by Examples B1 and B2, the Si-rich SiN layer obtained from Example B2, in which the HF and LF powers are lowered at the same time, has a higher silicon content and a higher refractive index. By lowering the HF and LF powers at the same time in the SiN deposition, the HCI index of the device obtained from Example B2 is increased from 120 years to 379 years.

When the SiN layer formed over the MOS transistor has a refractive of merely 1.95, the HCI index of the device is merely about 10 years. However, according to the above experiment results, by forming a Si-rich SiN layer with a higher refractive index, the HCI index can be much increased by several times or even tens of times. Hence, the semiconductor device structure of this invention is capable of reducing the hot carrier effect of the MOS transistors to increase the lifetime of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for reducing a hot carrier effect of a MOS transistor, comprising:
    forming a dielectric layer with a refractive index of about 2.00-2.30 directly on the MOS transistor, wherein the dielectric layer covers a source/drain region, a spacer and a gate conductor of the MOS transistor, such that the hot carrier effect is reduced.

2. The method of claim 1, wherein the dielectric layer comprises a silicon-rich silicon nitride layer.

3. The method of claim 2, wherein the refractive index of the silicon-rich silicon nitride layer ranges from 2.0 to 2.05.

4. The method of claim 2, wherein the refractive index of the silicon-rich silicon nitride layer ranges from 2.05 to 2.10.

5. The method of claim 2, wherein the refractive index of the silicon-rich silicon nitride layer ranges from 2.10 to 2.15.

6. The method of claim 2, wherein the refractive index of the silicon-rich silicon nitride layer ranges from 2.15 to 2.20.

7. The method of claim 2, wherein the refractive index of the silicon-rich silicon nitride layer ranges from 2.20 to 2.25.

8. The method of claim 2, wherein the refractive index of the silicon-rich silicon nitride layer ranges from 2.25 to 2.30.

* * * * *